(12) United States Patent
Gama et al.

(10) Patent No.: US 7,217,900 B2
(45) Date of Patent: May 15, 2007

(54) COOKING STOVE (75) Inventors: Atsuhito Gama, Nagoya (JP);
Yoshihiro Mizutani, Nagoya (JP)

(73) Assignee: Rinnai Corporation, Nagoya-Shi (JP)

( * ) Notice: Subject to any disclaimer, the term of this patent is extended or adjusted under 35 U.S.C. 154(b) by 21 days.

(21) Appl. No.: 11/110,755

(22) Filed: Apr. 21, 2005

(65) Prior Publication Data
US 2005/0235982 A1 Oct. 27, 2005

(30) Foreign Application Priority Data
Apr. 23, 2004 (JP) .............................. 2004-127672

(51) Int. Cl.
*H03K 17/975* (2006.01)
(52) U.S. Cl. ................ 200/600; 341/33; 219/494; 345/173
(58) Field of Classification Search ................ 200/5 A, 200/600, 511, 512, 296; 219/489, 490, 702, 219/715, 494, 464, 518, 453, 468, 448; 341/22, 341/33, 34, 176; 345/156, 168, 173, 176; 400/472
See application file for complete search history.

(56) References Cited

U.S. PATENT DOCUMENTS

| 4,894,493 | A | * | 1/1990 | Smith et al. ................ 200/5 A |
| 4,975,676 | A | * | 12/1990 | Greenhalgh ................ 200/5 A |
| 5,572,205 | A | * | 11/1996 | Caldwell et al. ............... 341/33 |
| 5,674,018 | A | * | 10/1997 | Kaufman et al. ........... 400/473 |
| 5,926,171 | A | * | 7/1999 | Matsufusa et al. .......... 345/173 |
| 6,723,937 | B2 | * | 4/2004 | Englemann et al. ........ 200/600 |
| 6,815,648 | B2 | * | 11/2004 | Badami et al. ............. 219/494 |

FOREIGN PATENT DOCUMENTS

JP 10-214677 A 8/1998

* cited by examiner

*Primary Examiner*—Michael A. Friedhofer
(74) *Attorney, Agent, or Firm*—Birch Stewart Kolasch & Birch, LLP (57) ABSTRACT

A cooking stove in which an operation circuit board formed with an electrode pattern is placed on a back surface of a glass top plate so as to suppress the formation of an air layer. The cooking stove includes a display mark and a switch mark provided on a front surface of the glass top plate so as to have a first positional relationship, a case having a display opening corresponding to the display mark with the first positional relationship and an operation circuit board opening corresponding to the switch mark, the case being bonded to the uneven back surface of the glass top plate so that the display opening is positioned at the display mark, and a bonding layer that bonds the back surface of the glass top plate to a part of the operation circuit board in which an electrode pattern is formed, via the operation circuit board opening in the case so that depressed portions of the back surface of the glass top plate are filled with a double coated tape having a foam as a base material.

7 Claims, 7 Drawing Sheets

COOKING STOVE

BACKGROUND OF THE INVENTION

1. Field of the Invention

The present invention relates to a cooking stove comprising heating means, and in particular, to a cooking stove comprising an operation portion on a top surface of a glass top plate to give an instruction on actuation of heating means.

2. Description of the Related Art

A drop-in type cooking stove is conventionally known in which a cooking stove main body is embedded in an opening formed in a counter top of a system kitchen. In this cooking stove, a glass top plate covering a top surface of the cooking stove main body comprises a capacitive touch switch used to give an instruction on actuation of heating means (see, for example, Japanese Patent Laid-Open No. 10-214677).

The capacitive touch switch is composed of a switch mark printed on a front surface of the glass top plate and an operation circuit board provided in proximity to the part of the back surface of the glass top plate which is opposite to the switch mark. An electrode pattern is formed on the operation circuit board to detect electrical capacitance. The operation circuit board is mounted so that the electrode pattern is located in the part of the back surface of the glass top plate which is opposite to the switch mark. Thus, when a user touches the switch mark, his or her finger, which is an electrostatic object, is detected via the electrode pattern.

Thus, in the conventional cooking stove, the circuit board formed with the electrode pattern is provided in proximity to the back surface of the flat glass top plate. In this case, since the glass top plate and the circuit board are both rigid, it is difficult to dispose the glass top plate and the circuit board so that the back surface of the glass top plate is in tight contact with the circuit board. Consequently, a gap, that is, an air layer is likely to be formed between the glass top plate and the circuit board.

In particular, if a glass top plate strengthened by making the back surface uneven is used, when the back surface of the glass top plate is contacted with the circuit board formed with the electrode pattern, the unevenness of the back surface increases the area of the air layer formed between the back surface and the circuit board. When the air layer is thus present between the back surface of the glass top plate and the circuit board, this may disadvantageously hinder the detection of an electrostatic object located on the front surface of the glass top plate.

It is thus an object of the present invention to provide a cooking stove in which an operation circuit board formed with an electrode pattern is provided on the back surface of the glass top plate so as to suppress the formation of an air layer.

SUMMARY OF THE INVENTION

The present invention is made in order to accomplish the above object and relates to improvements in a cooking stove comprising a glass top plate covering a top surface of a cooking stove main body accommodating heating means, an operation circuit board having an electrode pattern formed to detect an electrostatic object and mounted on a back surface of the glass top plate, and electrical capacitance detecting means for detecting an electrostatic object located on the part of a front surface of the glass top plate which is opposite to the electrode pattern, the electrical capacitance detecting means being constructed using the electrode pattern.

The cooking stove is characterized in that the cooking stove comprises a nonconductive bonding layer bonding the back surface of the glass top plate tightly to a part of the operation circuit board on which the electrode pattern is formed.

According to the present invention, the cooking stove comprises the bonding layer. The back surface of the glass top plate is tightly bonded to the part of the operation circuit board on which the electrode pattern is formed. This makes it possible to suppress the formation of an air layer between the back surface of the glass top plate and the part of the operation circuit board on which the electrode pattern is formed.

Further, the cooking stove is characterized in that the back surface of the glass top plate is uneven, and the bonding layer bonds the part of the operation circuit board on which the electrode pattern is formed to the uneven back surface of the glass top plate so that depressed portions of the back surface of the glass top plate are filled.

According to the present invention, the cooking stove comprises the bonding layer which fills the depressed portions in the back surface of the glass top plate. This makes it possible to tightly bond the back surface of the glass top plate to the part of the operation circuit board on which the electrode pattern is formed, while suppressing the formation of an air layer between the back surface and this part of the operation circuit board.

Furthermore, the cooking stove is characterized in that the bonding layer is a double coated tape formed using a foam as a base material and which is bonded, under pressure, between the back surface of the glass top plate and the part of the operation circuit board on which the electrode pattern is formed.

According to the present invention, the double coated tape is used to laminate, under pressure, the back surface of the glass top plate to the part of the operation circuit board on which the electrode pattern is formed. Accordingly, the foam, which is the base material of the double coated tape, is crushed between the back surface of the glass top plate and the part of the operation circuit board on which the electrode pattern is formed. Then, the back surface of the glass top plate tightly contacts, via the double coated tape, the part of the operation circuit board on which the electrode pattern is formed. In particular, if the back surface of the glass top plate is uneven, the foam, which is the base material of the double coated tape, abuts against the projecting portions of the back surface of the glass top plate and is thus crushed. Parts of the base material which are not in contact with the projecting portions enter and fill the depressed portions of the back surface of the glass top plate. This makes it possible to tightly bond the back surface of the glass top plate to the part of the operation circuit board on which the electrode pattern is formed.

Moreover, the cooking stove is characterized by further comprising a display mark provided on the part of the front surface of the glass top plate through which light is transmitted, a switch mark provided on the front surface of the glass top plate and having a first positional relationship with the display mark, and a case having a display opening and an operation circuit board opening respectively corresponding to the display mark and the switch mark with the first positional relationship, the case being mounted on the back surface of the glass top plate so that the display opening is positioned at the display mark, and in that the part of the operation circuit board on which the electrode pattern is formed is bonded by the bonding layer to the back surface of the glass top plate via the operation circuit board opening.

According to the present invention, the case is bonded to the back surface of the glass top plate so that the display opening in the case is positioned at the display mark provided on the front surface of the glass top plate. Consequently, the positional relationship (first positional relationship) between the display mark and the switch mark coincides with that between the display opening in the case and the operation circuit board opening. Thus, the part of the operation circuit board on which the electrode pattern is formed is bonded to the back surface of the glass top plate via the operation circuit board opening in the case. Therefore, the part of the operation circuit board on which the electrode pattern is formed can be easily placed in the part of the back surface of the glass top plate which is opposite to the switch mark provided on the front surface of the glass top plate.

Further, the cooking stove is characterized in that the case has a first guide portion having a second positional relationship with the display opening, and the cooking stove further comprises a display circuit board having lighting means and a second guide portion with the second positional relationship with the lighting means, the display circuit board being mounted in the case so that the second guide portion is positioned at the first guide portion.

According to the present invention, the display circuit board is mounted in the case so that the second guide of the display circuit board is positioned at the first guide of the case. Accordingly, the lighting means of the display circuit board can be placed so as to face the display opening in the case.

BRIEF DESCRIPTION OF THE DRAWINGS

FIGS. 5(a) and (b) are a diagram illustrating a step of mounting the case, an operation circuit board, and a display circuit board;

FIGS. 6(a) and (b) are a diagram illustrating a step of mounting the case, the operation circuit board, and the display circuit board.

DETAILED DESCRIPTION OF THE PREFERRED EMBODIMENT

Figure 1:
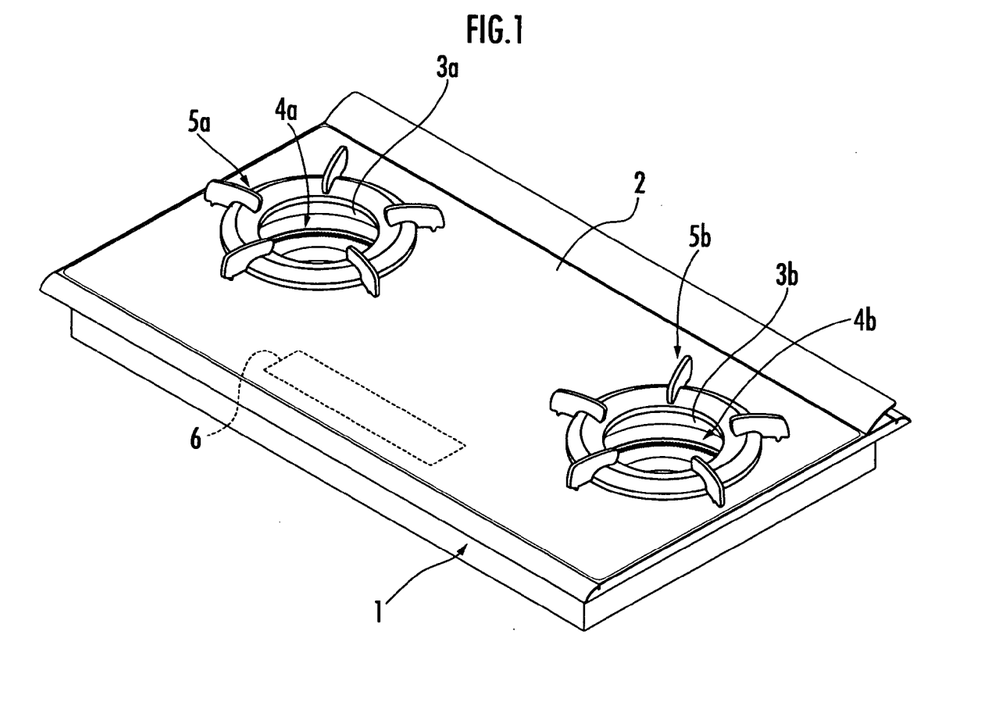
FIG. 1 is a diagram showing the appearance of a cooking stove according to the present invention.
Figure 2:
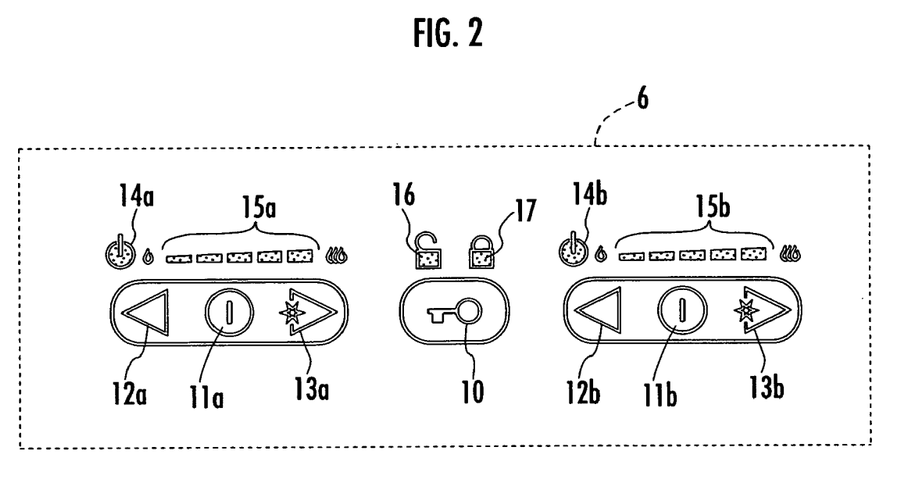
FIG. 2 is a diagram showing, in detail, various marks provided on a front surface of a glass top plate.
Figure 3:
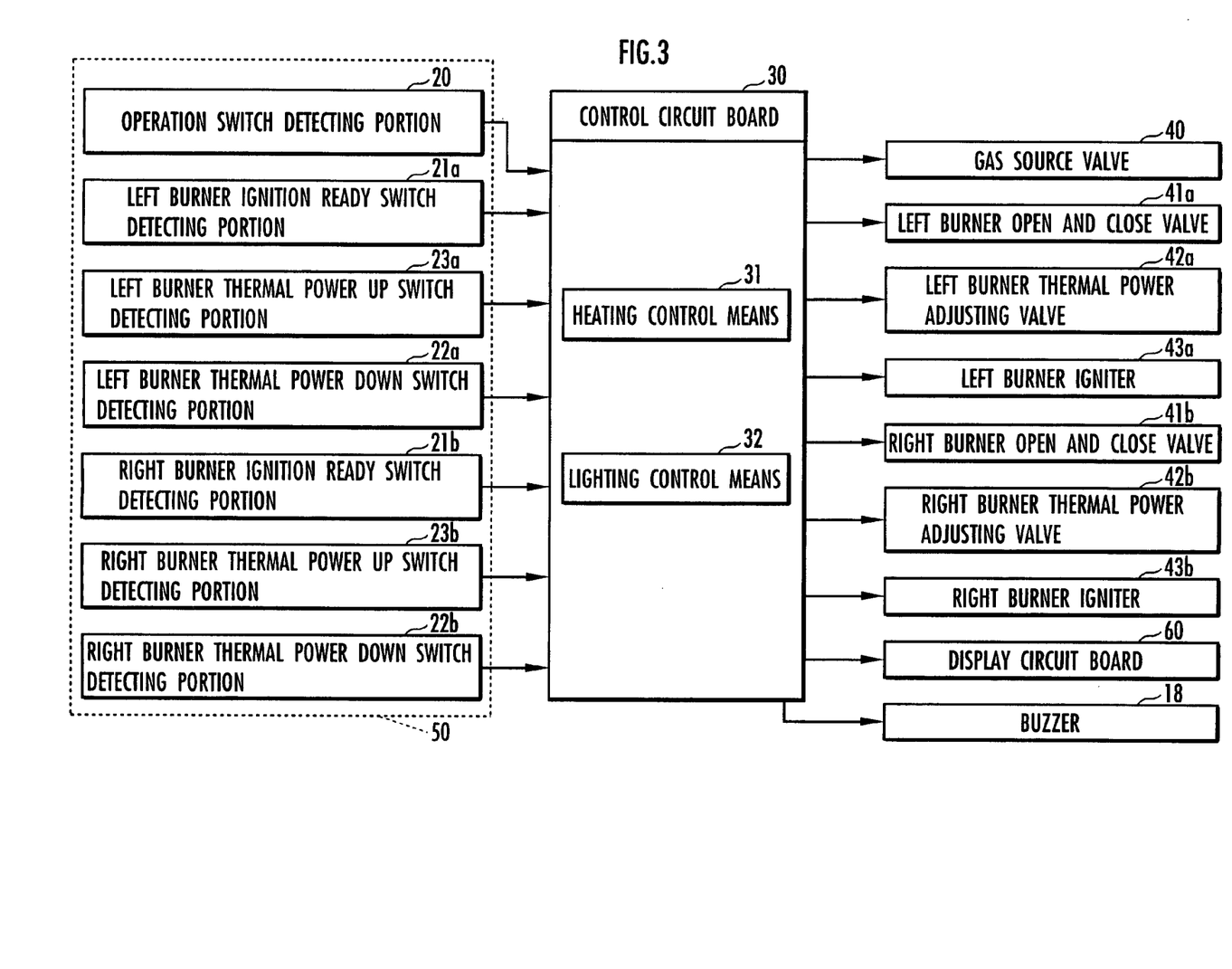
FIG. 3 is a control block diagram of the cooking stove.
Figure 4:
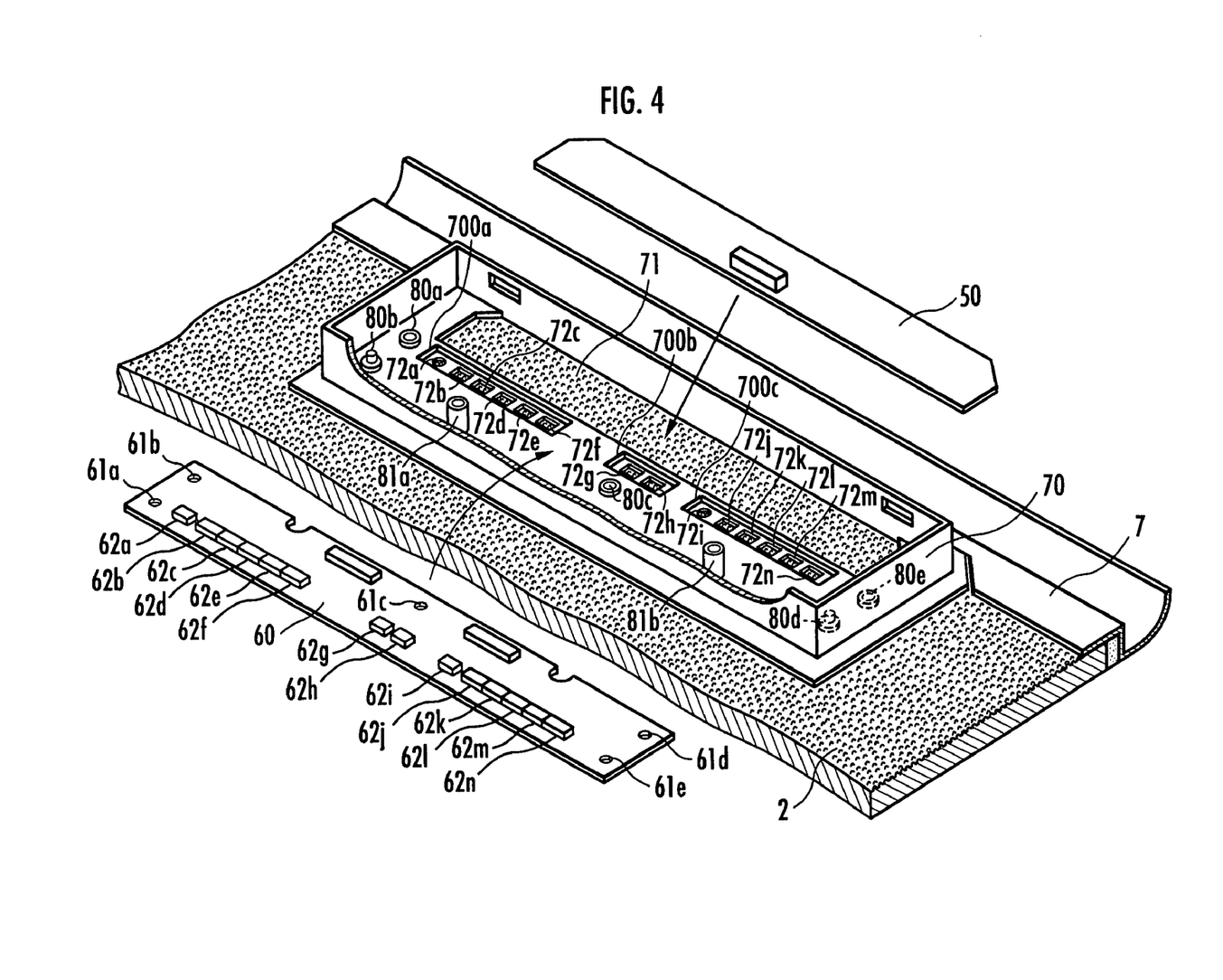
FIG. 4 is a perspective view showing how a case is mounted on a back surface of the glass top plate.
Figure 5:
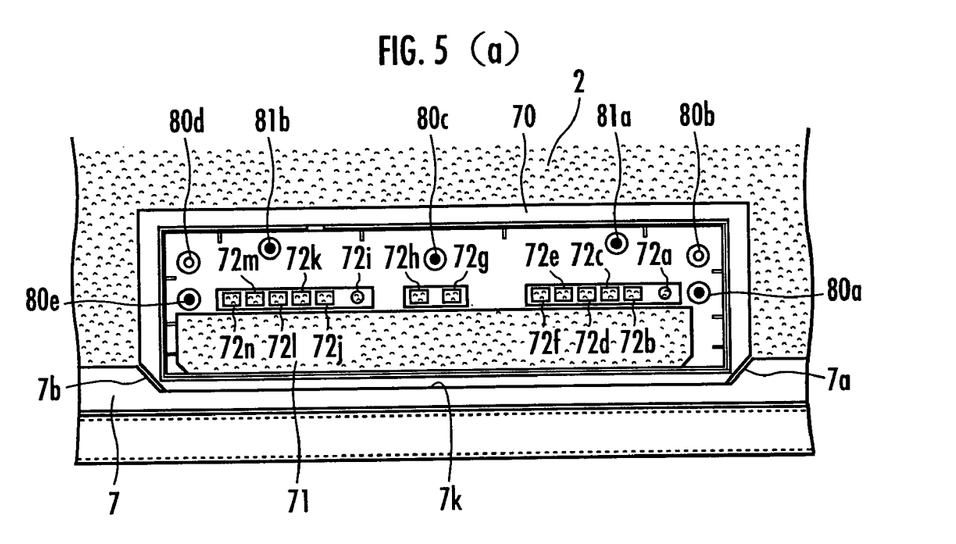
Figure 6:
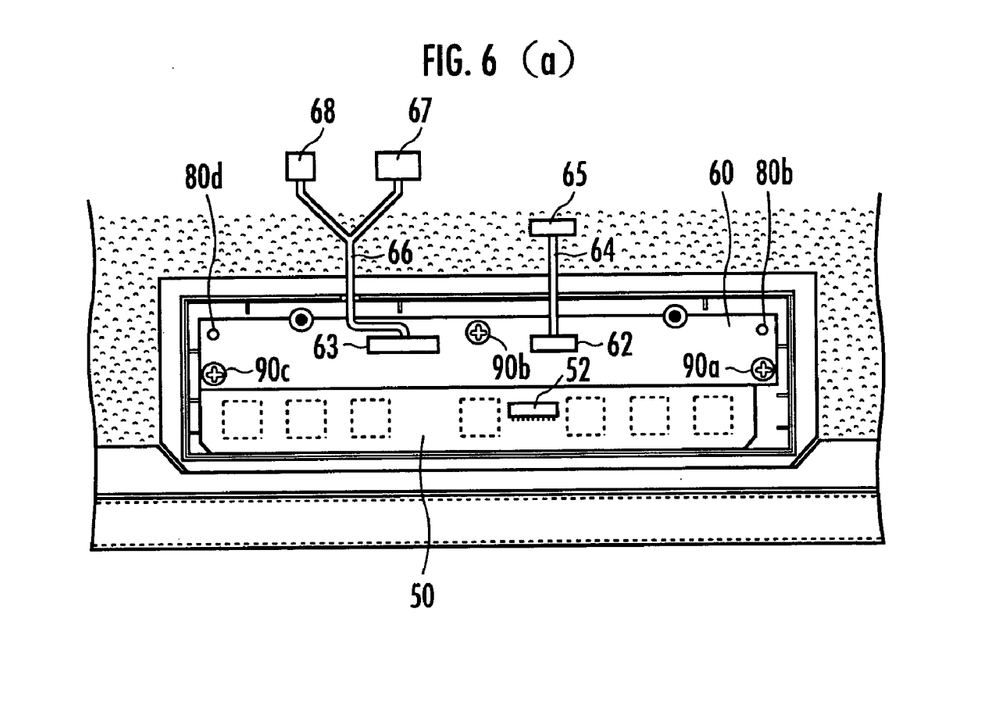
Figure 7:
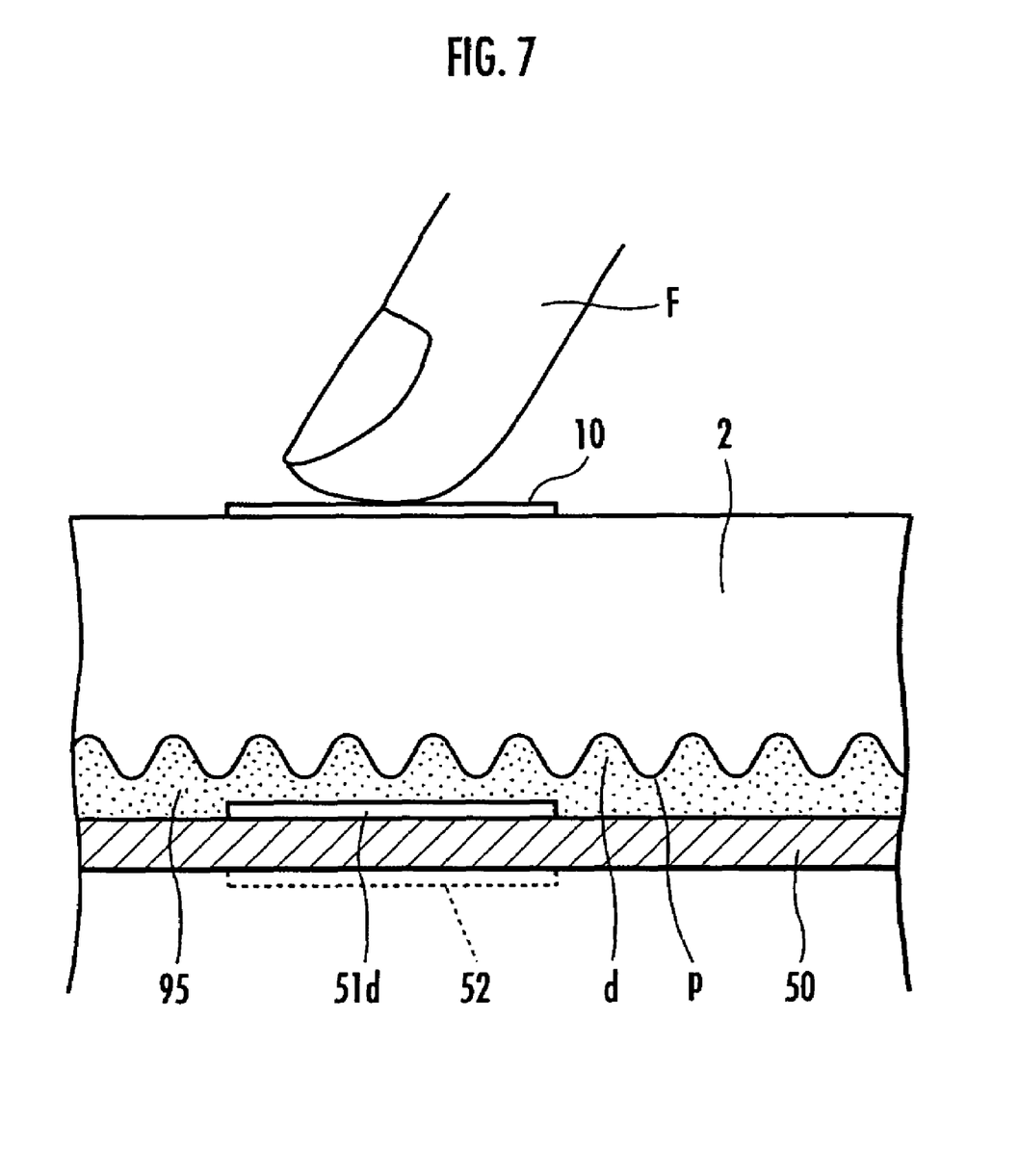
FIG. 7 is a sectional view of a capacitive switch.

An embodiment of the present invention will be described with reference to FIGS. 1 to 7. FIG. 1 is a diagram showing the appearance of a cooking stove according to the present invention. FIG. 2 is a diagram showing, in detail, various marks provided on a front surface of a glass top plate shown in FIG. 1. FIG. 3 is a control block diagram of the cooking stove. FIG. 4 is a perspective view showing how a case is mounted on a back surface of a glass top plate. FIGS. 5 and 6 illustrate a process of mounting the case, an operation circuit board, and a display circuit board. FIG. 7 is a sectional view of a capacitive switch.

FIG. 1 shows a drop-in type cooking stove in which a glass top plate 2 is installed on a top surface of a cooking stove main body 1; the glass top plate 2 is formed of crystallized glass which transmits light and which is extremely heat resistant. A lateral pair of cooking openings 3a and 3b is formed in the glass top plate 2. A left burner 4a and a right burner 4b (corresponding to heating means according to the present invention) are provided in the cooking stove main body 1 so as to face the cooking openings 3a and 3b, respectively. Further, trivets 5a and 5b are arranged at the cooking openings 3a and 3b, respectively, so that cooking containers can be placed on the trivets. An operation portion 6 is provided in the front part of the top surface of the glass top plate 2 to give an instruction on actuation of the left burner 4a and the right burner 4b.

With reference to FIG. 2, the operation portion 6 comprises an operation switch mark 10 constituting an operation switch that can be shifted between an "operation state" in which an instruction can be given on actuation of the left burner 4a and the right burner 4b and a "standby state" in which no instruction can be given on actuation of the left burner 4a or the right burner 4b, while the cooking stove is powered on. Further, to give an instruction on actuation of the left burner 4a, the operation portion 6 comprises an ignition ready switch mark 11a constituting an ignition ready switch that gets the left burner 4a ready for ignition, and a thermal power down switch mark 12a constituting a thermal power down switch and a thermal power up switch mark 13a constituting a thermal power up switch, the switch marks 12a and 13a varying the thermal power of the left burner 4a among five levels (levels 1 to 5).

The operation portion 6 also comprises an ignition ready display mark 14a constituting an ignition ready display portion lighted when the left burner 4a is ready for ignition or is in operation and a thermal power level display mark 15a constituting a thermal power level display portion that displays a thermal power setting for the left burner 4a.

Similarly, to give an instruction on actuation of the right burner 4b, the operation portion 6 comprises an ignition ready switch mark 11b constituting an ignition ready switch that gets the right burner 4b ready for ignition, a thermal power down switch mark 12b constituting a thermal power down switch and a thermal power up switch mark 13b constituting a thermal power up switch, the switch marks 12b and 13b varying the thermal power of the right burner 4b among five levels (levels 1 to 5), an ignition ready display mark 14b constituting an ignition ready display portion lighted when the right burner 4b is ready for ignition or is in operation, and a thermal power level display mark 15b constituting a thermal power level display portion that displays a thermal power setting for the right burner 4b. The thermal power level display marks 15a and 15b may be omitted.

The operation portion 6 further comprises an unlock display mark 16 constituting an unlock display portion lighted when the cooking stove is in the "operation state" and a lock display mark 17 constituting a lock display portion lighted when the operation switch is continuously operated for at least a predetermined time (for example, four seconds) to bring the cooking stove into what is called a child lock state in which none of the switches can be operated.

The switch marks in the operation portion 6 constitute a contactless touch switch together with an electrical capacitance detecting portion (corresponding to electrical capacitance detecting means according to the present invention) placed opposite to switch marks on a back surface of the glass top plate 2. When an electrostatic object is placed in the switch mark portion, the electrical capacitance detecting portion detects the electrostatic object to turn on the touch switch. On the other hand, when no electrostatic object is placed on the switch mark portion, the electrostatic capacitance detecting portion does not detect any electrostatic object. Accordingly, the touch switch remains off.

The display marks in the operation portion 6 constitute a display portion together with LEDs arranged opposite to display marks on the back surface of the glass top plate 2.

Turning on any of the LEDs lights the corresponding display portion. Turning off any of the LEDs extinguishes the corresponding display portion.

The thermal power level display portion composed of the thermal power level display mark 15*a* displays the thermal power level (levels 1 to 5) of the left burner 4*a* using the number of those of five lighting portions in a bar display which are lighted starting with the leftmost one as shown in FIG. 2. For example, when the left burner 4*a* has a thermal power level of 1, only the lighting portion at the left end of the bar display is lighted. When the left burner 4*a* has a thermal power level of 5, all the five lighting portions in the bar display are lighted. Similarly, the thermal power level display portion composed of the thermal power level display mark 15*b* displays the thermal power level (levels 1 to 5) of the right burner 4*b* using the number of those of five lighting portions in a bar display which are lighted starting with the leftmost one as shown in FIG. 2.

With reference to FIG. 3, the cooking stove main body 1 internally comprises a control circuit board 30 that controls the actuation of the entire cooking stove. A signal provided by the following and indicating detection of an electrostatic object is input to the control circuit board 30: an operation switch detecting portion 20, a left burner ignition ready switch detecting portion 21*a*, a left burner thermal power up switch detecting portion 23*a*, a left burner thermal power down switch detecting portion 22*a*, a right burner ignition ready switch detecting portion 21*b*, a right burner thermal power up switch detecting portion 23*b*, and a right burner thermal power down switch detecting portion 22*b* which constitute an electrical capacitance detecting portion placed in an operation circuit board 50 in association with the switch marks (operation switch mark 10, ignition ready switch marks 11*a* and 11*b*, thermal power down switch marks 12*a* and 12*b*, and thermal power up switch marks 13*a* and 13*b*) in the operation portion 6.

Control signals output by the control circuit board 30 control the actuation of a gas source valve 40 that switches between the supply and blockage of fuel gas to the cooking stove main body 1, a left burner open and close valve 41*a* that switches between the supply and blockage of fuel gas to the left burner 4*a*, a left burner thermal power adjusting valve 42*a* that varies the flow rate of fuel gas supplied to the left burner 4*a*, a left burner igniter 43*a* that applies a high voltage to an ignition electrode (not shown) of the left burner 4*a* to cause spark discharge, a right burner open and close valve 41*b* that switches between the supply and blockage of fuel gas to the right burner 4*b*, a right burner thermal power adjusting valve 42*b* that varies the flow rate of fuel gas supplied to the right burner 4*b*, and a right burner igniter 43*b* that applies a high voltage to an ignition electrode (not shown) of the right burner 4*b* to cause spark discharge.

Control signals output by the control circuit board 30 control lighting and extinction of LEDs (corresponding to the lighting means according to the present invention) provided on a display circuit board 60 in association with the display marks (ignition ready display marks 14*a* and 14*b*, thermal power level display marks 15*a* and 15*b*, unlock display mark 16, and lock display mark 17) provided in the operation portion 6, as well as turn-on and turn-off of a buzzer 18.

The control circuit board 30 also comprises heating control means 31 for controlling actuation of the left burner 4*a* and right burner 4*b* and lighting control means 32 for controlling lighting/extinction of the LEDs provided on the display circuit board 60 and causing the buzzer 18 to give warning.

FIG. 4 shows how the operation circuit board 50, comprising the electrical capacitance detecting portion corresponding to the switch marks in the operation portion 6, and the display circuit board 60, comprising the LEDs corresponding to the display marks in the operation portion 6, are arranged on the back surface of the glass top plate 2. A case 70 is bonded to the back surface of glass top plate 2 using a double coated tape; the case 70 comprises an operation circuit board opening 71 into which the operation circuit board 50 is fitted, a display opening 72 (72*a* to 72*n*) through which light emitted by the LED 62 (62*a* to 62*n*) is transmitted, and a positioning depressed portion 700 (700*a* to 700*c*) into which the LED 62 is fitted so that the LED 62 corresponds to the display opening 72.

The case 70 further comprises guide pins 80*b* and 80*d* used to position the display circuit board 60 in the case 70, posts 80*a*, 80*c*, and 80*e* having threaded holes used to mount the operation circuit board 50, and posts 81*a* and 81*b* having threaded holes used to mount a cover (not shown) of the case 70; the guide pins and the posts are provided so as to extend perpendicularly.

The display control circuit 60 has guide holes 61*b* and 61*d* formed to allow the LEDs 62*a* to 62*n* to be mounted in position with the display openings 72*a* to 72*n*, respectively, the guide holes 61*b* and 61*d* corresponding to the guide pins 80*b* and 80*d*, respectively, of the case 70, and threaded holes 61*a*, 61*c*, and 61*e* corresponding to the threaded holes of the posts 80*a*, 80*c*, and 80*e*, respectively, of the case 70. As shown in the figure, the back surface of the glass top plate 2 is uneven in order to, for example, increase its strength.

FIGS. 5(*a*), 5(*b*), and 6(*a*) show a first step (1) of mounting the case 70 on the back surface of the glass top plate 2, a second step (2) of mounting the operation circuit board 50 on the back surface of the glass top plate 2 via the case 70, and a third step (3) of mounting the display circuit board 60 in the case 70.

The first step will be described with reference to FIG. 5(*a*). In the first step, a cooking stove assembler roughly positions the case 70 by a butting the case 70 against an aluminum frame 7 installed around the periphery of the glass top plate 2 so that the case 70 lies along a notch 7*k* formed in the aluminum frame 7 so as to conform to the shape of the case 70. Reference numerals 7*a* and 7*b* denote opposite inclined sides of the notch 7*k*, and the case 70 is also provided with inclined portions corresponding to reference numerals 7*a* and 7*b*. This prevents the case 70 from being mounted in an incorrect direction.

The assembler then illuminates the front surface of the glass top plate 2 so that he or she can easily see the display marks in the operation portion 6 from the back surface of the glass top plate 2. Then, the assembler positions the display marks at the display opening 72 in the case 70. The assembler then uses a double coated tape to bond the case 70 to the back surface of the glass top plate 2.

In this case, the display opening 72*a* corresponds to the ignition ready display mark 14*a*. The display openings 72*b* to 72*f* correspond to the thermal power level display mark 15*a*. The display opening 72*g* corresponds to the unlock display mark 16. The display opening 72*h* corresponds to the lock display mark 17. The display opening 72*i* corresponds to the ignition ready display mark 14*b*. The display openings 72*j* to 72*n* correspond to the thermal power level display mark 15*b*. Thus, specifically, the case 70 is bonded to the back surface of the glass top plate 2 by positioning the display mark at the display opening on the basis of the above combinations.

If the thermal level display marks 15*a* and 15*b* are omitted as described above, other display marks are used for positioning at the display opening 72.

Now, the second step will be described with reference to FIG. 5(*b*). In the second step, the assembler releases release paper of the nonconductive double coated tape bonded to the operation circuit board 50 so that the tape covers the entire surface of the circuit board 50. The assembler thus places the operation circuit board 50 in the operation circuit board opening 71. The assembler then presses the operation circuit board 50 to tightly bond it to the back surface of the glass top plate 2. The double coated tape may be bonded so as to cover only a part of the operation circuit board 50 in which an electrode pattern 51 (51*a* to 51*g*) is formed, instead of the entire surface.

In this case, the display opening 72 (72*a* to 72*n*) in the case 70 and the operation circuit board opening 71 are formed so that their positional relationship coincides with that (corresponding to a first positional relationship according to the present invention) between the display marks 14*a*, 14*b*, 15*a*, 15*b*, 16, and 17 and the switch marks 10, 11*a*, 11*b*, 12*a*, 12*b*, 13*a*, and 13*b* on the operation portion 6.

In the first step, the case 70 is bonded to the back surface of the glass top plate 2 so that the display opening 72 (72*a* to 72*n*) is positioned at the display marks 14*a*, 14*b*, 15*a*, 15*b*, 16, and 17 in the operation portion 6. Thus, by placing the operation circuit board 50 in the operation circuit board opening 71 of the case 70 and bonding the operation circuit board 50 to the back surface of the glass top plate 2, it is possible to place the electrode pattern 51 (51*a* to 51*g*), formed on the operation circuit board 50 and serving as an electrical capacitance detecting portion, in the part of the back surface of the glass top plate 2 which is opposite to the switch marks 10, 11*a*, 11*b*, 12*a*, 12*b*, 13*a*, and 13*b* in the operation portion 6.

Specifically, the operation switch mark 10 is placed opposite to the electrode pattern 51*d*. The ignition ready switch mark 11*a* is placed opposite to the electrode pattern 51*b*. The thermal power down switch mark 12*a* is placed opposite to the electrode pattern 51*a*. The thermal power up switch mark 13*a* is placed opposite to the electrode pattern 51*c*. The ignition ready switch mark 11*b* is placed opposite to the electrode pattern 51*f*. The thermal power down switch mark 12*b* is placed opposite to the electrode pattern 51*e*. The thermal power up switch mark 13*b* is placed opposite to the electrode pattern 51*g*.

FIG. 7 is a sectional view of the vicinity of the operation switch mark 10 in which the operation circuit board 50 has been bonded to the back surface of the glass top plate 2. The back surface of the glass top plate 2 and the operation circuit board 50 are bonded together via a double coated tape 95. The double coated tape 95 is formed using a foam as a base material. Thus, as described above, when the operation circuit board 50 is pressed and bonded to the back surface of the glass top plate 2, parts of the double coated tape 95 are crushed which are in contact with the projecting portions p of the back surface of the glass top plate 2. The double coated tape 95 is thus pushed into the depressed portions d of the back surface of the glass top plate 2.

As a result, the operation circuit board 50 and the back surface of the glass top plate 2 are tightly bonded together so that the depressed portions d of the back surface of the glass top plate 2 are filled with the double coated tape 95. In this case, no air layer is formed between the electrode pattern 51*d*, formed on the front surface of the operation circuit board 50, and the back surface of the glass top plate 2. This prevents the air layer from degrading the accuracy with which the user's finger F is sensed.

Now, the third step will be described with reference to FIG. 6(*a*). The display circuit board 60 is provided with the positioning guide holes 61*b* and 61*d* and the threaded holes 61*a*, 61*c*, and 61*e* as shown in FIG. 4. The assembler places the case 70 opposite to the surface of the display circuit board 60 on which the LED 62 (62*a* to 62*n*) is provided. The positioning depressed portions 700*a* to 700*c* are positioned at a group of LEDs 62*a* to 62*f*, a group of LEDs 62*g* and 62*h*, and a group of LEDs 62*i* to 62*n*, respectively. Moreover, the display circuit board 60 is positioned by positioning the guide hole 61*b* at the guide pin 80*b*, while positioning the guide hole 61*d* at the guide pin 80*d*.

The assembler positions the threaded hole 61*a* at the threaded hole in the post 80*a* (see FIG. 5(*a*)) of the case 70 and rotatively inserts a screw 90*a* into the threaded holes.

The assembler positions the threaded hole 61*c* at the threaded hole in the post 80*c* (see FIG. 5(*a*)) and rotatively inserts a screw 90*b* into the threaded holes. The assembler positions the threaded hole 61*e* at the threaded hole in the post 80*e* (see FIG. 5(*a*)) and rotatively inserts a screw 90*c* into the threaded holes.

In this case, the positional relationship (corresponding to a second positional relationship according to the present invention) between the guide pins 80*b* and 80*d* (corresponding to a first guide portion according to the present invention) and display opening 72 (72*a* to 72*n*) in the case 70 is set so that it coincides with the positional relationship between the guide holes 61*b* and 61*d* (corresponding to a second guide portion according to the present invention) and LEDs 62*a* to 62*n* in the display circuit board 60.

Thus, by positioning the guide holes 61*b* and 61*d* in the display circuit board 60 to the guide pins 80*b* and 80*d* in the case 70, respectively, and screwing down the display circuit board 60 on the case 70, it is possible to mount the display circuit board 60 in the case 70 so that the LEDs 62*a* to 62*n*, provided on the display circuit board 60, are positioned at the display openings 72*a* to 72*n*, respectively, in the case 70.

In the first step, the display openings 72*a* to 72*n* in the case 70 are positioned at the display marks 14*a*, 14*b*, 15*a*, 15*b*, 16, and 17 on the front surface of the glass top plate 2. Thus, the LED 62*a* lies opposite to the ignition ready display mark 12*a* via the display opening 72*a*. The LEDs 62*b* to 62*f* lie opposite to the thermal power level display mark 15*a* via the display openings 72*b* to 72*f*, respectively. The LED 62*g* lies opposite to the unlock display mark 16 via the display opening 72*g*. The LED 62*h* lies opposite to the lock display mark 17 via the display opening 72*h*. The LED 62*i* lies opposite to the ignition ready display mark 12*b* via the display opening 72*g*. The LEDs 62*j* to 62*n* lie opposite to the thermal power level display mark 15*b* via the display openings 72*j* to 72*n*, respectively.

The assembler connects a connector 65 connected to a connector 62 of the display circuit board 60 via a cable 64, to a connector 52 of the operation circuit board 50. This makes it possible to feed power from the display circuit board 60 to the operation circuit board 50 and to transfer an electrostatic object detection signal from the electrical capacitance detecting portion, provided on the operation circuit board 50, to the display circuit board 60.

The assembler also connects connectors 67 and 68 connected to a connector 63 of the display circuit board 60 via a cable 66, to connectors 101 and 100, respectively, of the control circuit board 30, provided in the cooking stove main body, via relay connectors 67 and 68, as shown in the sectional view in FIG. 6(b). This makes it possible to feed power from the control circuit board 30 to the display circuit board 60. It is also possible to establish an interface between a control board 110 and the LEDs 62a to 62n, provided on the display circuit board 60, as well as an interface between the control board 110 and the electrical capacitance detecting portion composed of the electrode patterns 51a to 51g, formed on the operation circuit board 50.

With reference to FIG. 6(b), the assembler installs a rubber bush 75 in a through-hole 74 formed in a side of the case 70. The assembler uses the rubber bush 75 to fix the middle of the cable 66 to the case 70. This prevents force exerted on the cable 66 during an assembly operation from being transmitted directly to the display circuit board 60, resulting in, for example, a failure in the display circuit board 60.

In the present embodiment, the cooking stove comprising the gas burners 4a and 4b is shown as heating means according to the present invention. However, the present invention is applicable to a cooking stove comprising another type of heating means such as an electric heater.

Further, in the present embodiment, the case 70 is used as a positioning guide to facilitate the mounting of the operation circuit board 50 on the back surface of the glass top plate 2. However, the present invention is effective even if the operation circuit board 50 is mounted directly on the back surface of the glass top plate 2 without using the case 70.

Furthermore, in the present embodiment, the operation circuit board 50 is separate from the display circuit board 60. However, the present invention is effective even if these circuit boards are integrated together.

Moreover, in the present embodiment, the double coated tape 95 is used to form a bonding layer according to the present invention. However, an adhesive may be used to form a bonding layer.

Further, in the present embodiment, as shown in FIG. 7, the electrode pattern 51d is formed on the surface of the operation circuit board 50 which is bonded to the glass top plate 2. However, the present invention is effective even if the electrode pattern 52 is formed on the surface of the operation circuit board 50 which is not bonded to the glass top plate 2.

Furthermore, in the present embodiment, the cooking stove comprises the glass top plate 2 having the uneven back surface. However, the present invention is effective even if the cooking stove comprises a glass top plate having a flat back surface, provided that the cooking stove comprises a bonding layer that tightly bonds the back surface of the glass top plate to the operation circuit board.

Moreover, in the present embodiment, the guide pins 80b and 80d are provided on the case 70 as a first guide according to the present invention. The guide holes 61b and 61d are formed in the display circuit board 60 as a second guide according to the present invention. The positioning depressed portion 700 (700a to 700c) in the case 70 serves as the first guide according to the present invention. The LED 62 (62a to 62n) on the display circuit board 60 serves as the second guide according to the present invention. The positioning depressed portion 700 and the LED 62 are used to position the case 70 and the display circuit board 60. However, the case 70 and the display circuit board 60 may be positioned using only one of the positioning depressed portion 700 and the LED 62.

What is claimed is:

1. A cooking stove comprising:
a glass top plate covering a top surface of a cooking stove main body accommodating heating means;
an operation circuit board having an electrode pattern formed to detect an electrostatic object and mounted on a back surface of the glass top plate;
electrical capacitance detecting means for detecting an electrostatic object located on the part of a front surface of the glass top plate which is opposite to the electrode pattern, the electrical capacitance detecting means being constructed using the electrode pattern;
a nonconductive bonding layer bonding the back surface of the glass top plate tightly to a part of the operation circuit board on which the electrode pattern is formed;
a display mark provided on the part of the front surface of the glass top plate through which light is transmitted;
a switch mark provided on the front surface of the glass top plate and having a first positional relationship with the display mark; and
a case having a display opening and an operation circuit board opening respectively corresponding to the display mark and the switch mark with the first positional relationship, the case being mounted on the back surface of the glass top plate so that the display opening is positioned at the display mark,
wherein the part of the operation circuit board on which the electrode pattern is formed is bonded by the bonding layer to the back surface of the glass top plate via the operation circuit board opening.

2. The cooking stove according to claim 1, wherein the back surface of the glass top plate is uneven, and
the bonding layer bonds the part of the operation circuit board on which the electrode pattern is formed to the uneven back surface of the glass top plate so that depressed portions of the back surface of the glass top plate are filled.

3. The cooking stove according to claim 2, wherein the bonding layer is a double coated tape formed using a foam as a base material and which is bonded, under pressure, between the back surface of the glass top plate and the part of the operation circuit board on which the electrode pattern is formed.

4. The cooking stove according to claim 1, wherein the bonding layer is a double coated tape formed using a foam as a base material and which is bonded, under pressure, between the back surface of the glass top plate and the part of the operation circuit board on which the electrode pattern is formed.

5. The cooking stove according to claim 1, wherein the case has a first guide portion having a second positional relationship with the display opening, and
the cooking stove further comprises a display circuit board having lighting means and a second guide portion with the second positional relationship with the lighting means, the display circuit board being mounted in the case so that the second guide portion is positioned at the first guide portion.

6. The cooking stove according to claim 1, wherein the case has a depressed portion below a surface portion of the case; and
the cooking stove further comprises a display circuit board having lighting means protruding from an end surface thereof, the lighting means being fitted into the depressed portion and the case being in contact with the end surface of the display circuit board.

7. A cooking stove comprising:

a glass top plate covering a top surface of a cooking stove main body accommodating heating means;

an operation circuit board having an electrode pattern formed to detect an electrostatic object and mounted on a back surface of the glass top plate;

a display circuit board having lighting means protruding from an end surface thereof, the display circuit board being located beneath the glass top plate;

electrical capacitance detecting means for detecting an electrostatic object located on the part of a front surface of the glass top plate which is opposite to the electrode pattern, the electrical capacitance detecting means being constructed using the electrode pattern;

a nonconductive bonding layer bonding the back surface of the glass top plate tightly to a part of the operation circuit board on which the electrode pattern is formed; and a case having an operation circuit board opening and a depressed portion below a surface portion of the case, the case being mounted on the back surface of the glass top plate, wherein the lighting means of the display circuit board being fitted into the depressed portion and the case being in contact with the end surface of the display circuit board.

* * * * *